United States Patent [19]

Temple et al.

[11] Patent Number: 5,654,226
[45] Date of Patent: Aug. 5, 1997

[54] WAFER BONDING FOR POWER DEVICES

[75] Inventors: Victor Albert Keith Temple, Clifton; Stephen Daley Arthur, Scotia, both of N.Y.

[73] Assignee: Harris Corporation, Melbourne, Fla.

[21] Appl. No.: 305,435

[22] Filed: Sep. 7, 1994

[51] Int. Cl.[6] .......... H01L 21/20; H01L 21/302; H01L 21/304; H01L 21/463
[52] U.S. Cl. .......... 438/458; 438/456; 438/459; 438/464; 438/977; 438/421
[58] Field of Search .......... 437/974, 86, 62, 437/226; 148/DIG. 12, DIG. 135

[56] References Cited

U.S. PATENT DOCUMENTS

| | | | |
|---|---|---|---|
| 3,332,137 | 7/1967 | Kenney | 437/974 |
| 3,475,664 | 10/1969 | De Vries | 437/974 |
| 3,579,055 | 5/1971 | Ross | 437/974 |
| 3,623,219 | 11/1971 | Stoller et al. | 437/62 |
| 3,832,247 | 8/1974 | Saddler et al. | 437/974 |
| 5,091,331 | 2/1992 | Delgado et al. | 437/62 |
| 5,169,472 | 12/1992 | Goebel | 437/974 |
| 5,183,769 | 2/1993 | Rutter et al. | 437/974 |
| 5,385,632 | 1/1995 | Goossen | 437/209 |

Primary Examiner—John Niebling
Assistant Examiner—Brian K. Dutton
Attorney, Agent, or Firm—Rogers & Killeen

[57] ABSTRACT

A method of processing wafers for power devices in which the wafer has a desired thickness less than the thickness necessary to provide mechanical support. A silicon wafer of the desired thickness is bonded to a carrier wafer until most, if not all, of the processing steps are completed, after which the silicon wafer is separated from its carrier wafer. The carrier wafer may serve as a diffusion source, and the areas of the bonding of the silicon wafer to the carrier wafer may be selected consistent with the devices or groups of devices to be formed by the separation of the two wafers. The carrier wafer may by bonded to the device wafer over nearly the full surface area and the carrier wafer remain a part of the final device.

16 Claims, 2 Drawing Sheets

WAFER BONDING FOR POWER DEVICES

BACKGROUND OF THE INVENTION

As is well known, the wafers of power devices may be asymmetrically blocked ("AB") by a fairly thin (e.g., 15 v/um) wafer of epitaxially grown silicon on top of thick, highly doped substrate which provides the mechanical strength for processing. However, epitaxially grown wafers are expensive, and the yield diminishes with increasing thickness. For a MOS processible epitaxially grown wafer, the practical thickness limit is approximately 150 um to 200 um.

As is also well known, the wafers of power devices may also be symmetrically blocked ("SB"). However, the formation of vertical SB devices is nearly impossible because the reverse blocking junction is formed at the epitaxial-substrate interface.

It is desirable that the wafers used in the manufacture of both AB and SB devices be inexpensive, flat and contain minimum impurities. High voltage devices and virtually all SB devices are made from high resistivity single crystal silicon (predominantly float zone). Moreover, the exposure of the back of the wafer to processing permits the enhancement of performance by the use of backside shorts or gates for various purposes, which processing for SB devices may be similar to the frontside processing for high breakdown.

Such wafers must have sufficient thickness for processing, e.g., 15 to 20 mils or more. Thickness is not a problem for high voltage devices because the thickness is needed to support the voltage. However, the device forward drop and switching speed and losses are significantly and adversely affected by excess device thickness.

It is accordingly an object of the present invention to obviate the thickness problems of known methods of manufacturing power devices and to provide a novel method of processing wafers of a desired thickness less than the thickness necessary to provide the required mechanical strength.

In general, the silicon wafer of the desired thickness is bonded to a carrier wafer until most, if not all, of the processing steps are completed, after which the silicon wafer is separated from its carrier wafer.

In one aspect, the carrier wafer may serve as a diffusion source. In another aspect, the areas of the bonding of the silicon wafer to the carrier wafer are selected consistent with the devices or groups of devices to be formed by the separation of the two wafers.

In another aspect, the carrier wafer may by bonded to the device wafer over nearly the full surface area and the carrier wafer remain a part of the final device. In such devices, emitter regions formed in the backside of the device wafer may be electrically connected via a metallic silicide used for bonding to provide backside short circuits between the emitters and an improved performance.

In still another aspect, additional contacts for the backside of the device may be obtained by removing a portion of the carrier wafer so that the top of the carrier wafer may serves as a means for contacting different zones on the back surface of the device wafer.

Further, an antiparallel diode useful in almost all switching applications may be formed at the periphery of the device. Since the bond may not be very thick, a heavy but shallow diffusion into the carrier wafer of the same semiconductor type as used for the emitters of the device wafer assists the remaining diode current.

Where it is desirable to use near full bonding of device and carrier wafers in SB power devices of substantial thickness, the device wafer is easier to handle and the thickness of the carrier wafer may be reduced. In such devices, a lateral voltage capability may be built in and the carrier wafer need not be separated from the final device. Where the carrier wafer is to remain attached, it must have a high resistivity and have regions with sufficient resistivity to deal with high breakdown voltages. This may be accomplished by the creation of a well in the carrier wafer of a conductivity type the same as that of the emitters in the device wafer prior to the bonding of the two wafers, the regions being connected through a metallic bond.

However, where a single carrier wafer would be too thick for good diffusions to meet with sufficiently low resistivity, the carrier wafer may comprise two carrier wafers, i.e., a thin one with the well and reduced series resistivity, and a supporting wafer of the same conductivity.

It is accordingly an object of the present invention to provide a novel semiconductor device and method in which the device and carrier may be preformed and bonded together into a final device.

It is a further object of the present invention to provide a novel semiconductor device and method in which carrier wafer may be formed of two separate wafers.

The bonding of wafers is well known and includes oxide-to-silicon, oxide-to-oxide, and silicon-to-silicon bonding may be used. However, such bonding requires high temperature and/or high pressure.

It is another object of the present invention to obviate the need for high temperature and/or high pressure bonding techniques in the bonding of wafers, and to provide a novel method of bonding wafers for processing.

In one aspect, the bonding of the present invention is selected to provide only the mechanical and thermal performance required by the processing steps. In another aspect, the use of an intermediate material to form a silicon bonding compound at more moderate temperature and/or pressure is preferable.

These and many other objects and advantages will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
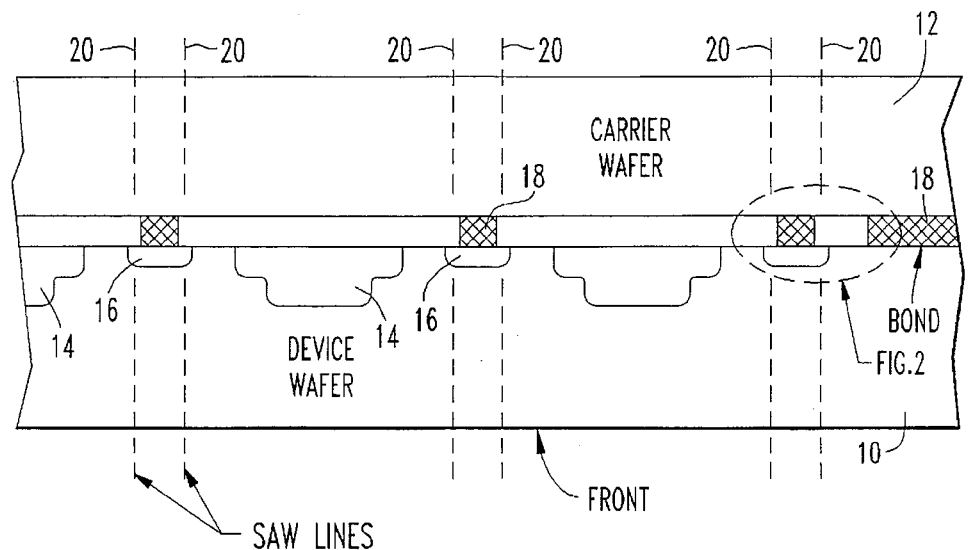
FIG. 1 is a pictorial view in elevation of a section of a bonded device and carrier wafer illustrating the selective bonding thereof.

With reference now to FIG. 1 where a bonded device wafer 10 and a carrier wafer 12 are illustrated in an elevational cross-section, the device wafer 10 may be partially processed on the backside to create a plurality of active areas 14 and a plurality of emitters 16. The two wafers may then be selectively bonded in the areas 18 sufficiently for the carrier wafer 12 to provide the necessary mechanical support for the processing of the front surface of the device wafer.

After the front surface of the device wafer 10 has been processed, the two bonded wafers may be cut along saw lines 20 to separate bonded dies and/or groups of bonded dies. Once the dies have been separated, the carrier wafer 12 may be removed from the device wafer by polishing or any other suitable conventional technique and the processing of the backside of the device wafer completed in a conventional manner. Where additional backside metalization is desired, it may be preferable to separate the dies in groups.

With reference to FIGS. 2A through 2F, each illustrates an enlargement of the encircled area marked "FIG. 2" in FIG. 1, and each illustrates a different type of the bond 20 of FIG. 1.

Figure 2A:
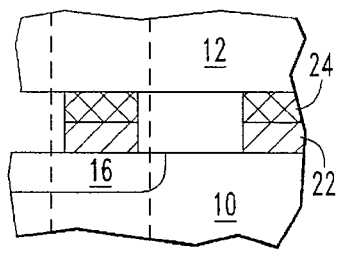
FIGS. 2A through 2F inclusive are pictorial views in elevation of a portion of FIG. 1 showing various bonds.

For example, and as shown in FIG. 2A, the bond between the device wafer 10 and the carrier wafer 12 may be between a first oxide layer 22 on the device wafer 10 and a second oxide layer 24 on the carrier wafer 12, the oxides having been created in a conventional manner by thermal oxidation and etching in the appropriate pattern.

Figure 2B:
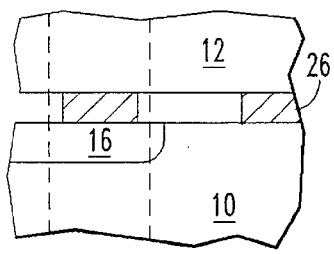

Further by way of example, and as shown in FIG. 2B, a oxide-to-silicon bond may be formed in any suitable conventional manner between an oxide layer 26 formed on either one of the wafers 10, 12 and the silicon of the other wafer 10, 12.

Figure 2C:
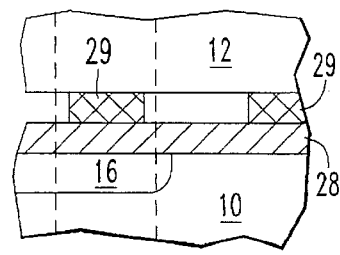

As shown in FIG. 2C, an oxide-to-oxide bond may be formed between a first oxide layer 28 formed on the device wafer and a patterned oxide layer 29 formed on the carrier wafer.

Figure 2D:
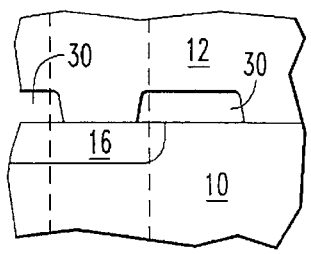

As shown in FIG. 2D, the bond may be a silicon-to-silicon bond in which the bond is established by patterning nitride on the areas to be bonded, growing a thermal oxide and then removing both the nitride and oxide to provide space 30 by which the surface pressure is reduced sufficiently to prevent silicon-to-silicon bonding in the formerly oxidized areas. That is, the bond may be formed by the steps of:

(i) providing a patterned nitride layer;

(ii) growing a thermal oxide over the silicon and nitride;

(iii) removing the surface of the wafer sufficiently to remove both oxide and nitride thereby leaving silicon at one thickness where only the oxide was grown and silicon at a lesser thickness where both the oxide and the nitride were grown.

Figure 2E:
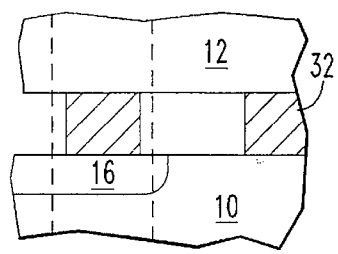

As further shown in FIG. 2E, the bond may be formed by silicide 32 where a metal (e.g., titanium, molybdenum, tungsten or platinum) may be put on the surface of one or the other of the two wafers 10, 12. Note that the silicide formation occurs at about 700° C. and a greatly reduced pressure due to the chemical nature of the bond.

Figure 2F:
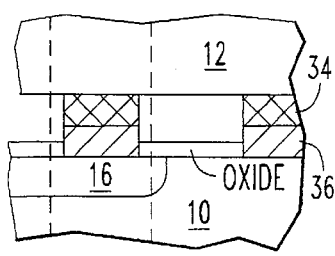

Finally, and as shown in FIG. 2F, the bond may be formed by silicide layers 34 and 36 formed respectively on both of the wafers 10, 12. One of the layers 34 and 36 may be a poly. The carrier wafer 12 may act as a diffusion source for the device wafer 10 prior to separation of the two wafers.

Figure 3:
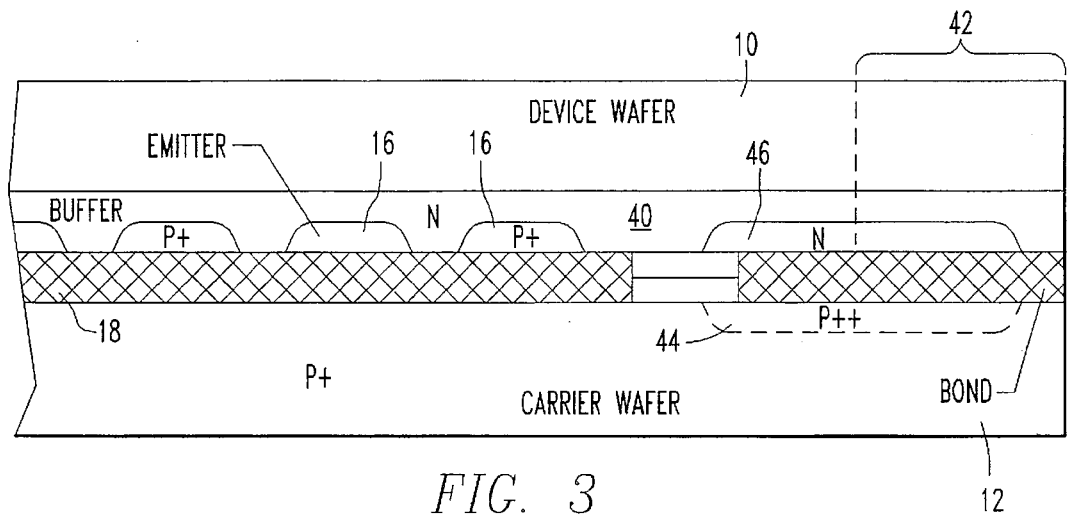
FIG. 3 is a pictorial view in elevation of two wafers with near full area bonding and a peripheral backside gate.

As shown in FIG. 3, it may be desirable to bond the carrier wafer to the device wafer over most, if not all, of the wafers and to eliminate the separation step. Where the wafers remain bonded, it is possible to build in emitter shorts which improve breakdown voltage, breakdown voltage ruggedness and switching speed. In addition, the antiparallel diode used in almost all switching applications can be built into the device. Finally, the silicide is generally not very thick and a carrier wafer's ability to supply diode current can be significantly enhanced with a shallow, very heavy diffusion of the same semiconductor type as the diode emitter. Silicide is the preferred bond for such devices.

As shown in FIG. 3 where like elements have been accorded like numerical designations to facilitate comparison with the preceding figures, the device wafer 10 is shown bonded to the carrier wafer 12 over substantially all of the surface area by silicide 18. In FIG. 3, emitter regions 16 are formed in the backside of the device wafer 10, which regions 16 are buffered by a region 40 of opposite semiconductor conductivity.

As shown in the embodiment illustrated in FIG. 3, the metallic silicide of the bond provides backside short circuits between the emitters 16.

Additional contacts for the backside of the device may be obtained by removing the portion 42 of the device wafer 10 shown in dashed lines in FIG. 3. In this way, the top of the carrier wafer 12 serves as a means for contacting different zones on the back surface of the device wafer 10 via the surface of the carrier 12 for a backside GTO-like gate.

There are SB power devices whose thickness is greater by a factor of 2 or more for an AB device having the same voltage rating. Because of the additional thickness, the device wafer is easier to handle and the thickness of the carrier wafer may be reduced. Where the carrier wafer is thin, a lateral voltage capability may be built in and the carrier wafer need not be separated from the final device. Where the carrier wafer is to remain attached, it must have a high resistivity and have regions with sufficient resistivity to deal with high breakdown voltages.

Figure 4:
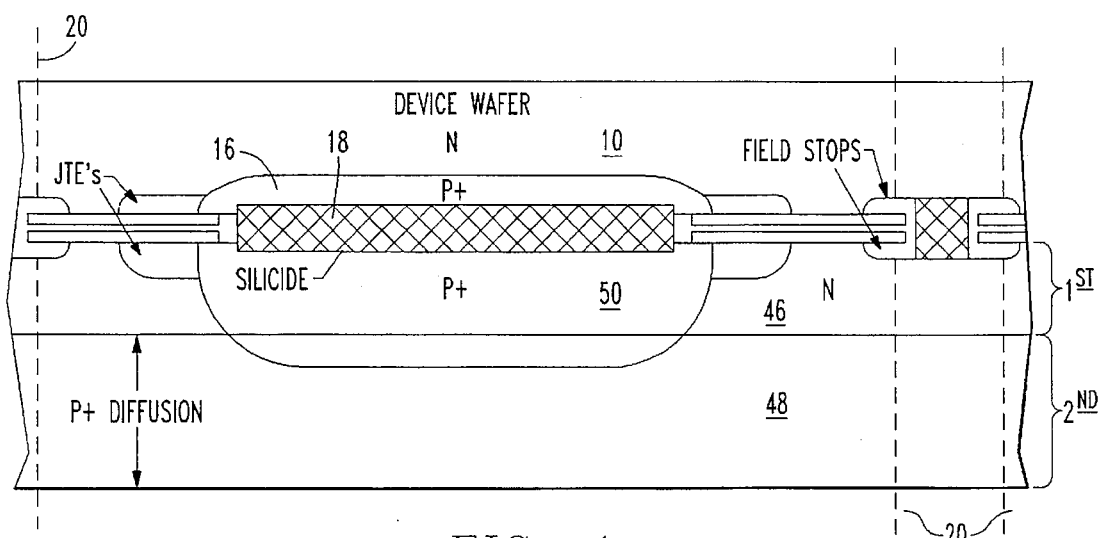
FIG. 4 is a pictorial view in elevation of an SB power device with two carriers.

In such SB devices, and as shown generally in FIG. 4, the carrier wafer may be of a conductivity type opposite to that of the emitters 16 of the device wafer 10, and a well 50 of the same conductivity type as the emitters 16 formed therein prior to the bonding of the two wafers. Because of the conductivity of the silicide bond 18, the emitter and well are connected to each other between opposite conductivity type of the device and carrier wafers.

With continued reference to the embodiment of a SB power device illustrated in FIG. 4, the carrier wafer 12 of the preceding figures may comprise two carrier wafers 46 and 48. This is desirable where a single carrier wafer would be too thick for good P+ diffusions to meet with sufficiently low resistivity. By reducing the thickness of the carrier wafer 46 adjacent the device wafer 10, the series resistivity thereof may be reduced. As shown in FIG. 4, the carrier wafer adjacent the device wafer has high resistivity and is heavily diffused where current flow is desired.

The second carrier wafer 48 may be of the same conductivity type as the emitter 16 of the device wafer 10 and the well 50 formed into the first carrier wafer 46 to thereby allow good diffusions to meet with sufficiently low resistivity.

As suggested in FIG. 4, adjacent dies thus formed may be separated by sawing along the lines 20 in the manner earlier described in connection with FIGS. 1 and 2.

While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

What is claimed is:

1. A method of separating a device wafer into plural devices comprising the steps of:

(a) providing a device wafer and a carrier wafer: and (b) bonding the device and carrier wafers with a bonding agent of first conductivity over first surface areas;

(c) removing the first surface areas to thereby separate the carrier wafer from the device wafer and divide the device wafer into the plural devices.

2. The method of claim 1 wherein the bonding agent is silicide.

3. The method of claim 1 wherein the device wafer has been processed on the back side thereof prior to bonding.

4. The method of claim 1 wherein the carrier wafer acts as a diffusion source for the device wafer.

5. The method of claim 1 wherein the bonding agent is a material which forms a silicon compound adequate to maintain the bond between the carrier and device wafers during the process of the front side of the device wafer at a temperature or pressure less than required to effect silicon-to-silicon, silicon-to-oxide, and oxide-to-oxide bonding of the two wafers.

6. The method of claim 5 wherein the material used to form the silicon compound is taken from the group consisting of titanium, molybdenum, tungsten and platinum.

7. The method of claim 1 wherein the bonding agent is pressural engagement of the carrier and device wafers, and wherein the bonding step comprises the steps of:

(i) providing a patterned nitride layer on the first surface areas of at least one of the carrier and device wafers which comprises silicon;

(ii) growing a thermal oxide over the silicon and the nitride;

(iii) removing the surface of the at least one wafer sufficiently to remove both the thermal oxide and the nitride thereby leaving silicon at one thickness where only the thermal oxide was grown and silicon at a lesser thickness where both the thermal oxide and the nitride were grown.

8. The method of claim 1 wherein the bonding agent is at least partially etched thermal oxide and the bond is either oxide-to-oxide or oxide-to-silicon.

9. A method of manufacturing a power device comprising the steps of:

(a) providing a device wafer having a thickness sufficient to mechanically support itself for the performance of process steps on the back side of the device wafer;

(b) performing the process steps on the back side of the device wafer so that the device wafer has a thickness less than sufficient to mechanically support the device wafer for subsequent front side processing;

(c) providing a carrier wafer;

(d) bonding the carrier wafer to the device wafer over spaced apart surface areas not needed for the power device;

(e) performing process steps on the front side of the device wafer;

(f) using the carrier wafer as a diffusion source for the device wafer; and (g) separating the carrier wafer from the device wafer by sawing the bonded carrier and device wafers at boundaries of the spaced apart surface areas to thereby provide the power device which has been processed on front and back sides.

10. The method of claim 9 wherein the bond between the carrier and device wafers is formed with a material which forms a silicon compound adequate to maintain the bond between the carrier and device wafers during the process steps on the front side of the device wafer at a temperature or pressure less than required to effect silicon-to-silicon, silicon-to-oxide, and oxide-to-oxide bonding of the carrier and device wafers.

11. The method of claim 9 wherein the the bond between the carrier wafer and the device wafer is formed with a silicide.

12. The method of claim 9 wherein the carrier wafer is bonded to the back side of the device wafer.

13. The method of claim 9 further comprising the step of performing initial process steps on the front side of the device wafer before or during the performance of the process steps on the back side of the device wafer in step (b).

14. A method of manufacturing plural semiconductor devices comprising the steps of:

(a) providing a device wafer and a carrier wafer;

(b) bonding the device wafer to the carrier wafer at first locations not needed in the semiconductor devices; and (c) severing the bonded wafers at boundaries of the first locations to thereby separate the device wafer from the carrier wafer at first ones of the semiconductor devices and to separate the semiconductor devices from the device wafer (d) before the bonding step (b), processing the device wafer between the first locations on a first surface thereof that will face the carrier wafer after the bonding step (b), the first processing step reducing the device wafer thickness to less than needed to mechanically support the device wafer during further processing of a second surface thereof.

15. The method of claim 14 further comprising the step of second processing the device wafer on the second surface thereof after the bonding step and before the severing step.

16. The method of claim 15 wherein step (b) further comprises the step of bonding the device wafer to the carrier wafer at second locations needed in second ones of the semiconductor devices, and wherein the device wafer and the carrier wafer are attached at the second locations in the second ones of the semiconductor devices after the bonded wafers are severed.

* * * * *